United States Patent
Nakayama

(10) Patent No.: US 9,194,055 B2
(45) Date of Patent: Nov. 24, 2015

(54) NITRIDE SEMICONDUCTOR SUBSTRATE

(75) Inventor: Satoshi Nakayama, Hitachi (JP)

(73) Assignee: SCIOCS COMPANY LIMITED, Hitachi (JP)

(*) Notice: Subject to any disclaimer, the term of this patent is extended or adjusted under 35 U.S.C. 154(b) by 25 days.

(21) Appl. No.: 12/713,272

(22) Filed: Feb. 26, 2010

(65) Prior Publication Data

US 2010/0258911 A1  Oct. 14, 2010

(30) Foreign Application Priority Data

Apr. 13, 2009  (JP) .................................. 2009-97254

(51) Int. Cl.
| | |
|---|---|
| *H01L 29/30* | (2006.01) |
| *C30B 25/18* | (2006.01) |
| *C30B 29/40* | (2006.01) |
| *C30B 33/06* | (2006.01) |
| *H01L 21/02* | (2006.01) |
| *H01L 29/20* | (2006.01) |

(52) U.S. Cl.
CPC ............. *C30B 25/183* (2013.01); *C30B 29/406* (2013.01); *C30B 33/06* (2013.01); *H01L 21/02013* (2013.01); *H01L 29/2003* (2013.01)

(58) Field of Classification Search
USPC ....................... 257/352, 651, E1.113, E21.22, 257/E21.221, E21.23, E21.237, E21.303, 257/E21.304, 617; 438/689, 46, 479, 483; 117/952, 11, 94, 88, 86, 103
See application file for complete search history.

(56) References Cited

U.S. PATENT DOCUMENTS

| | | | |
|---|---|---|---|
| 6,924,159 B2 | 8/2005 | Usui et al. | |
| 2002/0197825 A1 | 12/2002 | Usui et al. | |
| 2004/0221799 A1* | 11/2004 | Nakayama et al. | 117/94 |
| 2007/0261633 A1* | 11/2007 | Tanaka | 117/952 |

FOREIGN PATENT DOCUMENTS

JP  2003-178984 A  6/2003

* cited by examiner

*Primary Examiner* — Meiya Li
(74) *Attorney, Agent, or Firm* — Paul D. Bianco; Martin Fleit; Fleit Gibbons Gutman Bongini & Bianco PL

(57) ABSTRACT

A nitride semiconductor substrate is provided, having a concave or convex warpage on a front surface side, wherein when a rear surface side is placed on a flat surface, an average roughness of the rear surface at a part not in contact with the flat surface and at a part where a height from the flat surface to the rear surface is a prescribed value or more is set to be greater than an average roughness of the rear surface at a part where the height from the flat surface including a part in contact with the flat surface to the rear surface is less than the prescribed value.

6 Claims, 2 Drawing Sheets

NITRIDE SEMICONDUCTOR SUBSTRATE

TECHNICAL FIELD

The present invention relates to a nitride semiconductor substrate, and particularly relates to the nitride semiconductor substrate suitably used as a substrate for semiconductor growth such as a blue light emitting device.

DESCRIPTION OF RELATED ART

A silicon (Si) substrate and a gallium arsenide substrate already widely spread in the world as a substrate for semiconductor growth, are manufactured mainly by a pulling method. These substrates are manufactured by cutting-out a large-sized ingot, in which bulk crystals are grown from a melt, and are stably produced with few dislocations and defects.

Meanwhile, the bulk crystals can not be grown on the nitride semiconductor substrate, like Si and GaAs, and therefore the nitride semiconductor substrate is manufactured by making a nitride semiconductor grown thereon by using a substrate for growing the nitride semiconductor. As the substrate for growing the nitride semiconductor, a SiC substrate has been used heretofore. However, a single crystal sapphire substrate has been mainly used.

However, a lattice constant of the sapphire substrate is largely different from that of GaN, being the nitride semiconductor, and therefore a single crystal film of GaN can not be obtained if GaN is directly grown on the sapphire substrate. Therefore, there is a method of making a buffer layer of AlN and GaN grow on the sapphire substrate first at a relatively lower temperature, and next alleviating a distortion of lattice in this low temperature growing buffer layer, and then making GaN grow thereon.

A single crystal of GaN can be epitaxially-grown by using this low temperature growing nitride layer as the buffer layer. However, in this method also, GaN after growth has numerous defects, under an adverse influence of a large deviation of the lattice constant between the substrate and the crystal. Such defects are estimated to be a great obstacle for performance and reliability in manufacturing a GaN-based laser light emitting diode (LD) and a high luminance light emitting diode (LED).

For such a reason described above, the GaN freestanding substrate is requested to be produced, in which the deviation of lattice does not occur between the substrate and the crystal. As a method of realizing the GaN freestanding substrate satisfying such a request, for example, various methods are tried, such as HVPE (Hydride Vapor Phase Epitaxy) method, ultra-high temperature and high pressure method, and a flux method, etc. Among them, development of the GaN freestanding substrate by HVPE method is most advanced, and distribution to a market has already been started. The nitride semiconductor substrate manufactured by the HVPE method gathers attention as a high output and high efficient material of a bluish-purple laser light emitting diode (LD) and a blue light emitting device (LED).

As a most practical application of utilizing the GaN freestanding substrate, there is method of making a GaN layer epitaxially-grown thick on abase substrate, with dislocation density decreased, and peeling this GaN thick film layer from the base substrate, which is then used as the GaN freestanding substrate. Specifically, a Ti film is formed as an intermediate layer for peel-off, on the base substrate in which the GaN layer is formed on the sapphire substrate. Thereafter, by heating the Ti film in a mixed atmosphere of hydrogen gas and ammonia gas, void is formed in the GaN layer and also the Ti film is turned into a TiN film having fine pores. The GaN thick film layer is grown on the TiN film, then the GaN thick film layer is peeled from the sapphire substrate, to thereby fabricate a GaN freestanding substrate with relatively small warpage and low defects (for example, see patent document 1).

Japanese Patent Laid Open Publication No. 2003-178984

SUMMARY OF THE INVENTION

However, according to the aforementioned patent document 1, a thick film grows not using the ingot but using the base substrate for every nitride semiconductor substrate, and therefore variation occurs in a warpage shape of the substrate after processing, due to a specification of the base substrate, a growth condition in a furnace during growth of the thick film, or difference in apparatus, thus involving a problem that an in-surface temperature distribution becomes non-uniform in an epitaxial growth using such a nitride semiconductor substrate, and also a crystal mixing ratio of liquid crystal materials and a carrier concentration distribution become non-uniform.

In order to solve the above-described problem, the present invention is provided, and an object of the present invention is to provide the nitride semiconductor substrate on which an epitaxial crystal film can grow, with uniform in-surface temperature distribution during epitaxial growth and uniform crystal mixing ratio and carrier concentration.

According to an aspect of the present invention, a nitride semiconductor substrate is provided, having a concave or convex warpage on a front surface side, wherein when a rear surface side is placed on a flat surface, an average roughness of a rear surface at a part not in contact with the flat surface and at a part where a height from the flat surface to the rear surface is a prescribed value or more, is set to be greater than an average roughness of the rear surface at a part where a height from the flat surface including the part in contact with the flat surface to the rear surface is less than the prescribed value.

In this case, the prescribed value is preferably 5 μm. Further, the average roughness of the rear surface at a part where the height from the flat surface to the rear surface is 5 μm or more, is preferably set to be at least twice or more, or four times or more the average roughness of the rear surface at a part where the height from the flat surface to the rear surface is less than 5 μm.

Further, the average roughness of the rear surface at a part where the height from the flat surface including the part in contact with the flat surface to the rear surface is the prescribed value or more, is preferably set in such a manner as being gradually greater toward a direction in which the height is increased. In this case, when the average roughness of the rear surface at a part where the height from the flat surface including the part in contact with the flat surface to the rear surface is less than a prescribed value is set to be 0.3 μm, is less than a prescribed value is set to be 0.3 μm, the average roughness of the rear surface at a part where the height from the flat surface to the rear surface is 5 μm or more, is preferably set to be 0.6 μm.

Further, when the average roughness of the rear surface is set to be 0.3 μm, at a part where the height from the flat surface including the part in contact with the flat surface to the rear surface is less than the prescribed value, the average roughness of the rear surface at a part where the height from the flat surface to the rear surface is 5 μm or more, is preferably set to be 0.6 μm or more and 1.2 μm or less, and more preferably set to be 0.7 μm or more and 1.1 μm or less.

Further, the rear surface is preferably the rear surface to which a lapping treatment is applied by using abrasive grains made of boron carbide.

According to the present invention, the epitaxial crystal film can be grown, with uniform in-surface temperature distribution during epitaxial growth, and a uniform crystal mixing ratio and carrier concentration.

DESCRIPTION OF PREFERRED EMBODIMENT OF THE INVENTION

In a nitride semiconductor substrate such as a GaN substrate, non-uniform in-surface temperature distribution during growth can be given as a factor of inhibiting uniformity of an epitaxial growing layer formed on a surface (Ga surface) of the nitride semiconductor substrate. Normally, in an epitaxial growth, the nitride semiconductor substrate is stored in a susceptor. The nitride semiconductor substrate grows by receiving a conduction heat and a radiant heat on a rear surface (N-surface) from the susceptor. Apart where the nitride semiconductor substrate is in contact with the susceptor is influenced by the conduction heat, and therefore a temperature here is increased compared with other part. A part where the nitride semiconductor substrate is not in contact with the susceptor is influenced by the radiant heat, and therefore the temperature here is relatively decreased. As a result, the in-surface temperature distribution during growth is not uniform.

Incidentally, the nitride semiconductor substrate receives more radiant heat if its surface roughness is greater. Therefore, if the surface roughness of a part where the nitride semiconductor substrate is not in contact with the susceptor is made greater, the nitride semiconductor substrate at this part is influenced by the radiant heat, and the temperature can be increased. Therefore, when the average roughness of the rear surface is set to be greater at a part not in contact with the susceptor, the uniformity of the in-surface temperature of the substrate can be improved. The present invention is provided based on such knowledge.

According to an embodiment of the present invention, a nitride semiconductor substrate having a concave or convex warpage on a front surface side is provided, wherein when a rear surface is placed on a flat surface, an average roughness of the rear surface at a part not in contact with the flat surface and at a part where a height from the flat surface to the rear surface is a prescribed value or more, is set to be greater than an average roughness of the rear surface where the height from the flat surface including a part in contact with the flat surface, to the rear surface is less than the prescribed value.

Figure 4:
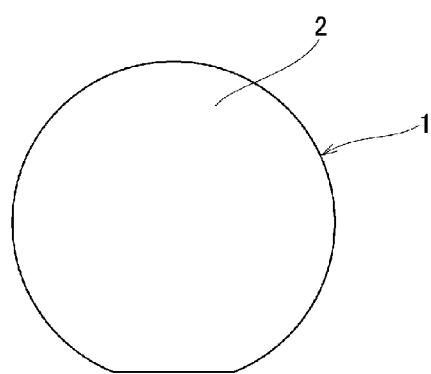
FIG. 4 is a front view of the nitride semiconductor substrate according to an embodiment of the present invention.

As shown in FIG. 4, in a nitride semiconductor substrate 1, a front surface 2 and a rear surface have circular shapes, and an orientation flat is formed on its outer periphery. Such a nitride semiconductor substrate 1 has a warpage. The warpage of the nitride semiconductor substrate means a state of a substrate surface, in a state that the nitride semiconductor substrate is not adsorbed on the flat surface, such as a natural state that the nitride semiconductor substrate is simply placed on a horizontally held base plate having a smooth surface.

Figure 1:
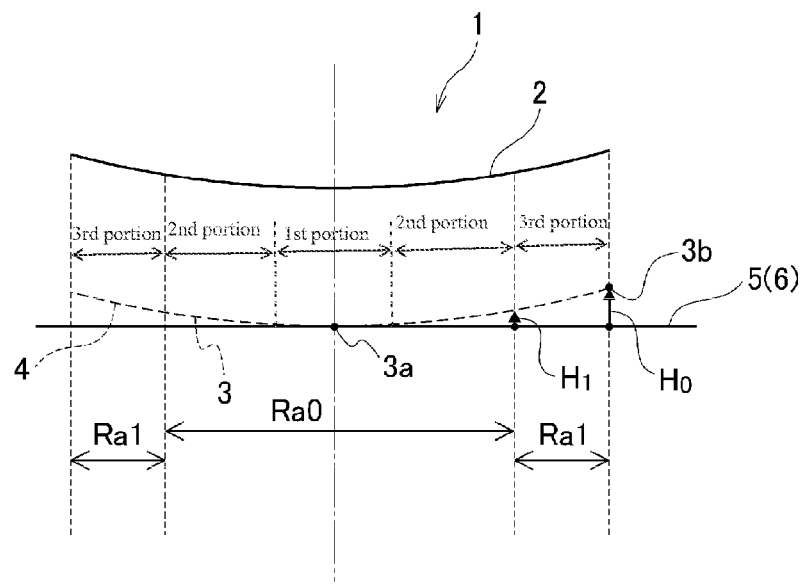
FIG. 1 is a schematic sectional view of a nitride semiconductor substrate having a concave warpage on a front surface side, according to an embodiment of the present invention.

As the nitride semiconductor substrate having concave warpage on the front surface side, for example as shown in FIG. 1, the nitride semiconductor substrate 1 with uniform warpage having a minimal point can be given. The minimal point 3a on a rear surface 3 side is included in a part where the nitride semiconductor substrate 1 is in contact with flat surface 5. The minimal point 3a is normally a center part of the nitride semiconductor substrate 1. A height from the flat surface 5 to the rear surface 3 at a part not in contact with the flat surface 5 is defined as H. Further, height H0 from the flat surface 5 to the rear surface 3 at an outer peripheral edge part 3b of the nitride semiconductor substrate 1 is defined as a warpage amount.

Rough surface treatment is applied to an entire surface of the rear surface 3 of the nitride semiconductor substrate 1. An arithmetic average roughness of the rear surface 3 at a part where the height H from the flat surface 5 to the rear surface 3 is a prescribed value H1 or more, is defined as Ra1. An arithmetic average roughness of the rear surface 3 at a part where the height H from the flat surface 5 including the part in contact with the flat surface 5 to the rear surface 3 is less than the prescribed value H1, is defined as Ra0. Rough surface treatment is applied to the rear surface 3, with the prescribed value H1 as a boundary portion, so as to satisfy a relational expression:

$$Ra1 > Ra0 \quad (1).$$

Figure 2:
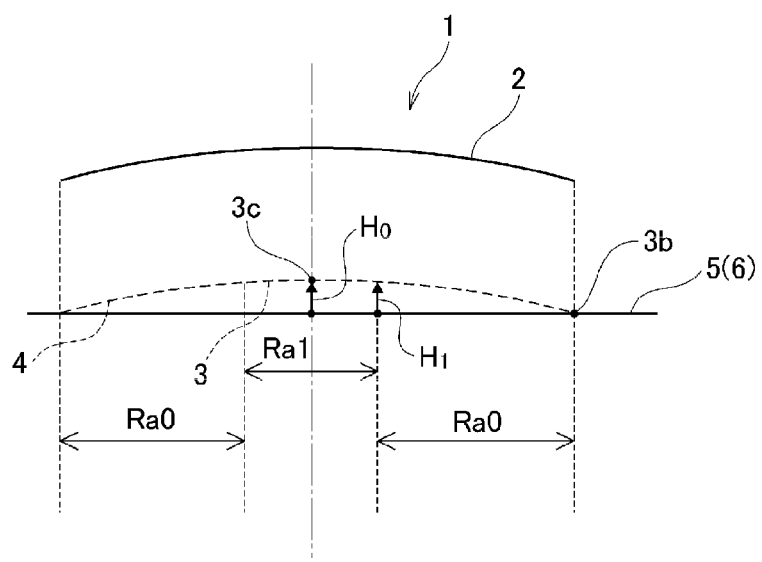
FIG. 2 is a schematic sectional view of a nitride semiconductor substrate having a convex warpage on a front surface side, according to an embodiment of the present invention.

Further, as the nitride semiconductor substrate having a convex warpage on the front surface side, for example as shown in FIG. 2, the nitride semiconductor substrate 1 with a uniform warpage having a maximum point can be given. The part where the nitride semiconductor substrate 1 is in contact with the flat surface becomes the outer peripheral edge part on the rear surface 3 side. The maximum point 3c on the rear surface 3 side is included in the part not in contact with the flat surface 5. The maximum point 3c is normally the center part of the nitride semiconductor substrate 1. The height H from the flat surface 5 to the rear surface 3 at the part not in contact with the flat surface 5, is defined as H. Further, height H0 from the flat surface 5 to the rear surface 3 at the outer peripheral edge part 3b of the nitride semiconductor substrate 1 is defined as the warpage amount.

The arithmetic average roughness of the rear surface 3 at a part where the height H from the flat surface 5 to the rear surface 3 is a prescribed value H1 or more, is defined as Ra1. The arithmetic average roughness of the rear surface 3 is defined as Ra0, at a part where the height H from the flat surface 5 including the part in contact with the flat surface 5 to the rear surface 3 is less than the prescribed value H1, is less than the prescribed value H1. Rough surface treatment is applied to the rear surface 3, with the prescribed value H1 as a boundary portion, so as to satisfy a relational expression:

$$Ra1 > Ra0 \quad (2).$$

Note that the arithmetic average roughness is also called simply average roughness.

In order to make an epitaxial layer grow on the surface of the nitride semiconductor substrate 1 of the aforementioned embodiment, the nitride semiconductor substrate 1 is stored in a susceptor 6. In the nitride semiconductor substrate 1 thus stored in the susceptor 6, average roughness Ra1 of the rear surface 3 at a part where the height H from the susceptor 6 to the rear surface 3 is a prescribed value H1 or more, is greater than average roughness Ra0 of the rear surface 3 at a part where the height of the susceptor 6 including a part in contact with a bottom surface of the susceptor 6, being the flat surface, to the rear surface 3 is less than the prescribed value H1. As the surface roughness Ra of the nitride semiconductor substrate 1 becomes greater, more influence of the radiant heat from the susceptor 6 is received. Therefore, the temperature of the part where the height H from the susceptor 6 to the rear surface 3 is the prescribed value H1 or more, is higher than the temperature of the part where the height H is less than the prescribed value H1.

Accordingly, the temperature of a rear surface part of the nitride semiconductor substrate 1 not in contact with the susceptor 6 where temperature is decreased, can be increased, compared with the rear surface part in contact with the susceptor 6 of the nitride semiconductor substrate 1. Therefore, the in-surface temperature distribution of the substrate during epitaxial growth can be made uniform. As a result, an epitaxial crystal film with uniform crystal mixing ratio of mixed crystal materials and uniform carrier concentration can be grown.

Further, the crystal mixing ratio of the mixed crystal materials and the carrier concentration distribution can be made uniform, by varying the average roughness of the rear surface of the nitride semiconductor substrate. Therefore, even if a warpage-shaped variation occurs in the nitride semiconductor substrate obtained as a result of a thick film growth as described in the patent document 1, a quality of elements after epitaxial growth can be made uniform and a production yield can be improved. As a result, performance and reliability can be further improved, in manufacturing a GaN-based laser light emitting diode (LD) and a high luminance light emitting diode (LED).

In the above-described embodiment, the nitride semiconductor substrate has preferably a prescribed value of 5 μm. The reason why the prescribed value is set to be 5 μm is that when it exceeds 5 μm, an influence of the radiant heat given to the rear surface from the susceptor becomes dominant.

Further, the average roughness of the rear surface at a part where the height from the flat surface to the rear surface of a non-contact part is 5 μm or more is preferably set to be at least twice or more and four times or less the average roughness of the rear surface at a part where the height from the flat surface including a contact part to the rear surface is less than 5 μm.

Here, the reason why the average roughness is set to be twice or more is that when it is less than this value, a remarkable difference is not observed in the in-surface uniformity. Further, the reason why the difference in the average roughness is set to be four times or less is that when it exceeds this value, the difference in the average roughness becomes great, to thereby generate a difference in the in-surface temperature distribution reversely during epitaxial growth, resulting in generating an adverse influence in the variation of the carrier concentration.

Further, in the aforementioned embodiment, in the rear surface part not in contact with the flat surface, the average roughness of the rear surface at a part where the height from the flat surface to the rear surface is a prescribed value or more, is set to be greater than the average roughness of the rear surface at a part where the height from the flat surface to the rear surface is less than the prescribed value. However, the average roughness of the rear surface may be gradually greater, with a part of a prescribed value as a boundary portion, or may be gradually greater toward the part of the prescribed value, or may be gradually greater passing through the part of the prescribed value. Further, the average roughness of the rear surface are formed not only on the rear surface part not in contact with the flat surface but also on the part in contact with the flat surface, and may be gradually greater from a substrate center part to the rear surface part not in contact with the flat surface. Here, gradually greater average roughness means a case that the average roughness is continuously greater and a case that it is gradually greater.

When the average roughness of the rear surface is gradually greater, as the height from the flat surface to the rear surface becomes higher, sudden change of the average roughness at the part not in contact with the flat surface can be suppressed. Therefore, when the average roughness is suddenly changed, the variation of the carrier concentration observed in its boundary portion can be suppressed.

EXAMPLES

Example 1

A plurality of nitride semiconductor substrates obtained by HVPE method and the method described in the patent document 1 were prepared. Here, the method described in the patent document 1 is the method of forming a Ti film as an intermediate layer for peel-off, on the base substrate in which the GaN layer is formed on the sapphire substrate. Thereafter, by heating the Ti film in a mixed atmosphere of hydrogen gas and ammonia gas, void was formed in the GaN layer and the Ti film was turned into a TiN film having fine pores. This is a method of making the GaN thick film layer grow on the TiN film, and peeling the GaN thick film layer from the sapphire substrate. The nitride semiconductor substrate obtained by this method has a concave warpage on the front surface side, wherein a warpage amount is 7 μm, thickness is 0.4 mm, and diameter is ϕ2 inches. Lapping treatment was applied to the rear surface of the nitride semiconductor substrate, by using abrasive grains having grain size of about 10 μm made of boron carbide ($B_4C$). When roughness of the center part of the rear surface was measured after the lapping treatment, the arithmetic average roughness Ra was 0.3 μm. Note that the center part of the rear surface means the part in contact with the rear surface, which is the part where the height from the flat surface including not only the part in contact with the rear surface but also the part not in contact with the rear surface, is less than 5 μm.

Here, additional treatment was applied to a rear surface outer peripheral part where the height from the flat surface was 5 μm or more due to the warpage shape, by using the abrasive grains, with grain size varied. The additional treatment was performed, so that the surface roughness of the rear surface outer peripheral part of each nitride semiconductor substrate was roughened at a pitch of 0.1 μm. The arithmetic average roughness Ra was 0.3 to 1.4 μm in the rear surface outer peripheral part of each nitride semiconductor substrate.

Figure 3:
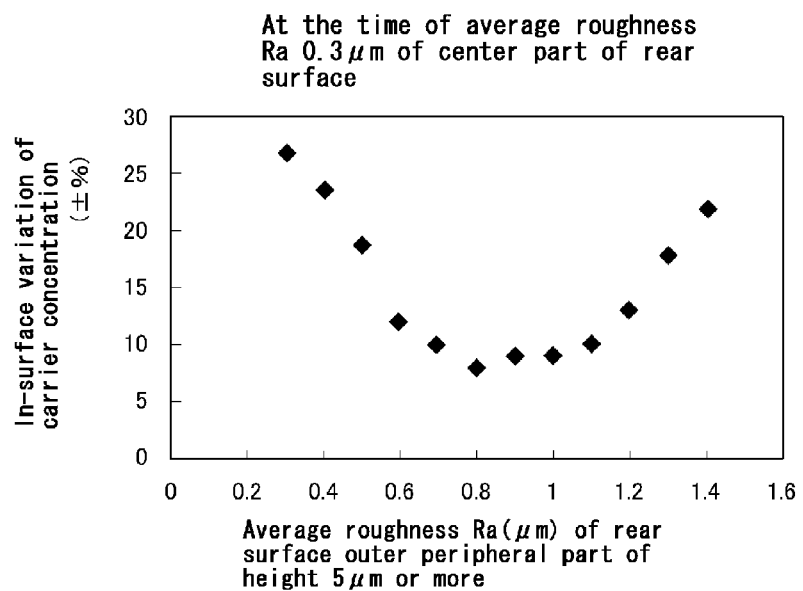
FIG. 3 is a view showing an evaluation result of an in-surface variation of a carrier concentration with respect to an average roughness, according to an embodiment of the present invention.

By using the nitride semiconductor substrate as it is, the epitaxial growth of n-type GaN, with its surface doped with Si, was caused on its surface, and the uniformity of the carrier concentration in the surface of the substrate was evaluated. Results thereof are shown in table 1 and FIG. 3.

TABLE 1

| Average roughness Ra (μm) of rear surface center part | Average roughness Ra (μm) of rear surface outer peripheral part | In-surface variation (±%) of carrier concentration | Results |
| --- | --- | --- | --- |
| 0.3 | 0.3 | 27 | X |
|  | 0.4 | 24 | X |
|  | 0.5 | 19 | Δ |
|  | 0.6 | 12 | ○ |
|  | 0.7 | 10 | ○ |
|  | 0.8 | 8 | ○ |
|  | 0.9 | 9 | ○ |
|  | 1.0 | 9 | ○ |
|  | 1.1 | 10 | ○ |
|  | 1.2 | 13 | ○ |
|  | 1.3 | 18 | Δ |
|  | 1.4 | 22 | X |

When the in-surface uniformity of the carrier concentration was evaluated, the variation of the carrier concentration was less than ±20%, in a range 0.5-1.3 μm of the arithmetic average roughness Ra at a rear surface outer peripheral part where the height was 5 μm or more. If the average roughness Ra fell within a range of 0.6-1.2 μm, an excellent result was obtained, such that the variation of the carrier concentration was ±13% or less. If the average roughness Ra fell within a range of 0.7-1.1 μm, a further excellent result was obtained, such that the variation of the carrier concentration was ±10% or less.

However, if the average roughness Ra was less than 0.5 μm and beyond 1.3 μm, a poor result was obtained, such that the variation of the carrier concentration was beyond ±20%. Thus, it was found that in order to suppress the variation of the carrier concentration to ±13% or less, the average roughness Ra at the rear surface outer peripheral part where the height was 5 μm or more, was preferably twice or more the average roughness Ra 0.3 μm (0.6 μm or more) of the rear surface center part, and four times or less the average roughness Ra 0.3 μm (1.2 μm or less).

Example 2

In the same way as the example 1, the lapping treatment was applied to the nitride semiconductor substrate, so that the average roughness Ra of the rear surface was 0.3 μm. Additional lapping treatment was applied to the nitride semiconductor substrate, so that the average roughness of the rear surface outer peripheral part was gradually roughened from the average roughness of the rear surface center part toward a direction in which the height from the bottom part of the rear surface was increased, to thereby obtain the average roughness Ra 0.6 μm of the rear surface outer peripheral part where the height from the bottom part of the rear surface was 5 μm or more. As a result of measuring the carrier concentration, the variation fell within ±10%, and an excellent result was obtained.

When the average roughness of the rear surface was suddenly changed at a part of height 5 μm as shown in the example 1, the variation of the carrier concentration was beyond ±10% when the average roughness was 0.6 μm. However, as shown in the example 2, it was found that the variation could be suppressed to fall within ±10% even if the average roughness was 0.6 μm, by suppressing a sudden change of the average roughness by gradually roughening the average roughness of the rear surface. This is because the variation of the carrier concentration can be suppressed, which is observed in its boundary part, by suppressing the sudden change of the average roughness at the rear surface center part and the rear surface outer peripheral part.

Comparative Example 1

In the same way as the example 1, the nitride semiconductor substrate was prepared, with diameter of φ2 inches, having concave warpage on the front surface, with warpage amount of about 5 μm, then the same lapping treatment was applied thereto, and a uniform surface of the substrate was obtained, with the in-surface roughness of the rear surface set to be 0.1 μm.

When the epitaxial growth was caused under the same condition as the condition of the example 1 by the MOVPE apparatus using this substrate as it was, a poor result was obtained, such that the in-surface carrier concentration was high in the center part and was gradually decreased toward the outer periphery, and the in-surface variation of the carrier concentration was ±20%.

What is claimed is:

1. A nitride semiconductor substrate, comprising:
   a front surface as a surface on which a nitride semiconductor crystal is grown;
   a rear surface as a surface of an opposite side of the front surface, and
   warping so that the front surface side is a concave surface, and the rear surface side is a convex surface,
   wherein when mounted on a flat surface of a susceptor having the flat surface so that the rear surface is opposed to the flat surface, the rear surface has:
   a rear surface center part which has a part in contact with the flat surface, and a part not in contact with the flat surface, with a distance from the flat surface being less than 5 μm, and
   a rear surface outer peripheral part which is a part positioned outside of the rear surface center part and not in contact with the flat surface, with a distance from the flat surface being 5 μm or more, and
   wherein an arithmetic average roughness of the rear surface outer peripheral part is larger than an arithmetic average roughness of the rear surface center part.

2. The nitride semiconductor substrate according to claim 1, wherein the arithmetic average roughness of the rear surface outer peripheral part is from twice to four times the arithmetic average roughness of the rear surface center part.

3. The nitride semiconductor substrate according to claim 1, wherein the arithmetic average roughness of the rear surface outer peripheral part gradually increases in a direction in which a distance between the rear surface and the flat surface increases.

4. The nitride semiconductor substrate according to claim 1, wherein the arithmetic average roughness of the rear surface center part is set to 0.3 μm, and the arithmetic average roughness of the rear surface outer peripheral part is set to from 0.6 μm to 1.2 μm.

5. The nitride semiconductor substrate according to claim 1, wherein the arithmetic average roughness of the rear surface center part is set to 0.3 μm, and the arithmetic average roughness of the rear surface outer peripheral part is set to from 0.7 μm to 1.1 μm.

6. The nitride semiconductor substrate according to claim 1, wherein the arithmetic average roughness of the rear surface center part is set to 0.3 μm, and the arithmetic average roughness of the rear surface outer peripheral part is set to 0.6 μm.

* * * * *